(12) United States Patent
Wu et al.

(10) Patent No.: US 10,127,875 B2
(45) Date of Patent: Nov. 13, 2018

(54) SHIFT REGISTER UNIT, RELATED GATE DRIVER AND DISPLAY APPARATUS, AND METHOD FOR DRIVING THE SAME

(71) Applicants: BOE TECHNOLOGY GROUP CO., LTD, Beijing (CN); Chengdu BOE Optoelectronics Technology Co., Ltd., Chengdu (CN)

(72) Inventors: Bo Wu, Beijing (CN); Xiaojing Qi, Beijing (CN); Wen Tan, Beijing (CN)

(73) Assignees: BOE TECHNOLOGY CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 186 days.

(21) Appl. No.: 15/038,377

(22) PCT Filed: Dec. 10, 2015

(86) PCT No.: PCT/CN2015/096928
§ 371 (c)(1),
(2) Date: May 20, 2016

(87) PCT Pub. No.: WO2016/124042
PCT Pub. Date: Aug. 11, 2016

(65) Prior Publication Data
US 2016/0365054 A1    Dec. 15, 2016

(30) Foreign Application Priority Data
Feb. 2, 2015 (CN) .......................... 2015 1 0053547

(51) Int. Cl.
*G11C 19/00* (2006.01)
*G09G 3/36* (2006.01)
*G11C 19/28* (2006.01)

(52) U.S. Cl.
CPC .......... *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS

2004/0140839 A1* 7/2004 Nagao .................... G11C 19/00
327/291
2007/0248204 A1* 10/2007 Tobita .................... G11C 19/28
377/64
(Continued)

FOREIGN PATENT DOCUMENTS

| CN | 102945651 A | 2/2013 |
| CN | 103021309 A | 4/2013 |

(Continued)

OTHER PUBLICATIONS

The State Intellectual Property Office of the People's Republic of China (SIPO), Office Action 1 for 201510053547.2, dated Aug. 3, 2016, pp. 1-13.
(Continued)

*Primary Examiner* — Tuan T Lam
(74) *Attorney, Agent, or Firm* — Anova Law Group, PLLC

(57) ABSTRACT

The present disclosure provides a shift register unit. The shift register unit includes a pre-charge reset module; a pull-up module; a pull-down module; a first pull-down control module; and a second pull-down control module. The pre-charge reset module is connected to a forward scanning control signal input terminal, a reverse scanning control signal input terminal, a first signal input terminal, a second signal input terminal, and a pull-up control node. The (Continued)

pull-up module is connected to the pull-up control node, an input terminal of a first clock signal, and a signal output terminal. The first pull-down control module is connected to a pull-down control node, the forward scanning control signal input terminal, the reverse scanning control signal input terminal, the first signal input terminal, and the second signal input terminal.

16 Claims, 6 Drawing Sheets

(52) U.S. Cl.
CPC ............... *G09G 2300/0408* (2013.01); *G09G 2300/0809* (2013.01); *G09G 2310/0286* (2013.01); *G09G 2310/08* (2013.01)

(56) References Cited

U.S. PATENT DOCUMENTS

| | | | |
|---|---|---|---|
| 2008/0101529 A1* | 5/2008 | Tobita | G09G 3/3677 377/64 |
| 2008/0219401 A1* | 9/2008 | Tobita | G09G 3/3677 377/79 |
| 2011/0222645 A1* | 9/2011 | Tobita | G09G 3/3677 377/78 |
| 2013/0169609 A1* | 7/2013 | Son | G11C 19/28 345/209 |
| 2014/0118237 A1 | 5/2014 | Wang | |
| 2015/0179277 A1 | 6/2015 | Pai et al. | |
| 2016/0253975 A1* | 9/2016 | Yang | G11C 19/28 345/58 |
| 2016/0268004 A1* | 9/2016 | Li | G11C 19/28 |
| 2016/0372063 A1* | 12/2016 | Li | G11C 19/28 |
| 2017/0018243 A1* | 1/2017 | Huang | G09G 3/36 |
| 2017/0039971 A1* | 2/2017 | Huang | G09G 3/3677 |
| 2017/0061913 A1* | 3/2017 | Wang | G09G 3/36 |
| 2017/0154656 A1* | 6/2017 | Yeh | G11C 7/00 |
| 2017/0256220 A1* | 9/2017 | Huang | G09G 3/3677 |

FOREIGN PATENT DOCUMENTS

| | | |
|---|---|---|
| CN | 103165189 A | 6/2013 |
| CN | 103187040 A | 7/2013 |
| CN | 103714792 A | 4/2014 |
| CN | 103761992 A | 4/2014 |
| CN | 104064153 A | 9/2014 |
| CN | 104091573 A | 10/2014 |
| CN | 104240765 A | 12/2014 |
| CN | 104299583 A | 1/2015 |
| CN | 104318909 A | 1/2015 |
| CN | 104575430 A | 4/2015 |
| EP | 2725571 A1 | 4/2014 |
| JP | 2007317288 A | 12/2007 |
| KR | 20140014746 A | 2/2014 |

OTHER PUBLICATIONS

The World Intellectual Property Organization (WIPO), International Search Report for PCT/CN2015/096928, dated Mar. 22, 2016, pp. 1-5.

The European Patent Office (EPO) The Extended European Search Report for 15858101.7 dated Jul. 26, 2018 15 Pages.

* cited by examiner

SHIFT REGISTER UNIT, RELATED GATE DRIVER AND DISPLAY APPARATUS, AND METHOD FOR DRIVING THE SAME

CROSS-REFERENCES TO RELATED APPLICATIONS

This application is a national phase entry under 35 U.S.C. § 371 of International Application No. PCT/CN2015/096928, filed on Dec. 10, 2015, which claims priority to Chinese Patent Application No. 201510053547.2, filed on Feb. 2, 2015. The above enumerated patent applications are incorporated by reference herein in their entirety.

FIELD

The present invention generally relates to the display technologies and, more particularly, relates to a shift register unit, a related gate driver and display apparatus, and a method for driving the same.

BACKGROUND

To display a frame, gate drivers of the thin film transistor-liquid crystal display (TFT-LCD) apply square waves of certain widths to each row of pixels from the top to the bottom of a display panel to turn on desired driving transistors of the pixels. Source drivers supply image signals to each row of pixels from the top to the bottom. Currently, the fabrication of for this type of display panels includes using chip on film (COF) or chip on glass (COG) technologies to form gate drivers and source drivers on glass panels/substrates. However, when the display is of higher resolutions, there are more output lines from the gate drivers and source drivers. This may result in a longer driving circuit and may impair the bonding process for the driving circuit modules.

In order to overcome the above problems, current fabrication methods often include using gate drive on array (GOA) circuits in display panels. Compared with existing COF or COG technologies, GOA may be less expensive. Using the GOA circuits, a display panel may be symmetric and does not need to leave space for the bonding area and the circuit layout area for the gate drivers, which is key to implementing a narrow bezel design. The GOA technology may also improve the capacity and the production yield of the device. However, as illustrated in FIG. 1, some problems still exist in GOA circuits. For example, each shift register may include many TFTs (M1~M6, M8~M14) in the GOA circuits. Each shift register can only drive one row of gate lines. The circuits may thus occupy a relatively large area. Therefore, reducing the total area of the GOA circuits is crucial in implementing a design of a thin bezel display.

BRIEF SUMMARY

The present disclosure provides shift registers, driving circuits, and display apparatus to address one or more problems in the existing GOA circuits.

An aspect of the present disclosure provides a shift register unit. The shift register unit includes a pre-charge reset module; a pull-up module; a pull-down module; a first pull-down control module; and a second pull-down control module, wherein: the pre-charge reset module is connected to a forward scanning control signal input terminal, a reverse scanning control signal input terminal, a first signal input terminal, a second signal input terminal, and a pull-up control node; the pull-up module is connected to the pull-up control node, an input terminal of a first clock signal, and a signal output terminal; the first pull-down control module is connected to a pull-down control node, the forward scanning control signal input terminal, the reverse scanning control signal input terminal, the first signal input terminal, and the second signal input terminal; the second pull-down control module is connected to the pull-down control node and an input terminal of a clock control signal; and the pull-down module is connected to the pull-down control node, the pull-up control node, and the signal output terminal.

Optionally, the pre-charge reset module is configured to reset a potential of the pull-up control node according to input signals from the forward scanning control signal input terminal, the reverse scanning control signal input terminal, the first signal input terminal, and the second signal input terminal.

Optionally, the pull-up module is configured to pull up a potential of the signal output terminal according to a potential from the pull-up control node and an input signal from the input terminal of the first clock signal.

Optionally, the first pull-down control module is configured to control a potential of the pull-down control node according to signals from the forward scanning control signal input terminal, the reverse scanning control signal input terminal, the first signal input terminal, and the second signal input terminal.

Optionally, the second pull-down control module is configured to control the potential of the pull-down control node according to signals from the input terminal of the clock control signal.

Optionally, the pull-down module is configured to control potentials of the pull-up control node and the signal output terminal according to the potential of the pull-down control node.

Optionally, the pre-charge reset module further including a first transistor and a second transistor, wherein: a first terminal of the first transistor is connected to the forward scanning control signal input terminal, a second terminal of the first transistor is connected to the pull-up control node, and a control terminal of the first transistor is connected to the first signal input terminal; and a first terminal of the second transistor is connected to the pull-up control node, a second terminal of the second transistor is connected to the reverse scanning control signal input terminal, and a control terminal of the second transistor is connected to the second signal input terminal.

Optionally, the pull-up module further including a third transistor and a first charging capacitor, wherein: a first terminal of the third transistor is connected to the input terminal of the first clock signal, a second terminal of the third transistor connected to the signal output terminal, and a control terminal of the third transistor is connected to the pull-up control node; and a first terminal of the first charging capacitor is connected to the pull-up control node and a second terminal of the first charging capacitor is connected to the signal output terminal.

Optionally, the first pull-down control module further including a fourth transistor and a fifth transistor, wherein: a first terminal of the fourth transistor is connected to the pull-down control node, a second terminal of the fourth transistor is connected to the reverse scanning control signal input terminal, and a control terminal of the fourth transistor connected to the first signal input terminal; and a first terminal of the fifth transistor is connected to the pull-down control node, a second terminal of the fifth transistor is connected to the forward scanning control signal input terminal, and a control terminal of the fifth transistor is connected to the second signal input terminal.

Optionally, the input terminal of the clock control signal further including an input terminal of a second clock signal and the second pull-down control module further including a sixth transistor, wherein: a first terminal of the sixth transistor is connected to a high potential terminal; a second terminal of the sixth transistor is connected to the pull-down control node; and a control terminal of the sixth transistor is connected to the input terminal of the second clock signal.

Optionally, the input terminal of the clock control signal further including an input terminal of a third clock signal and an input terminal of a fourth clock signal, and the second pull-down control module further including a tenth transistor, an eleventh transistor, a twelfth transistor, and a thirteenth transistor, wherein: a first terminal of the tenth transistor is connected to the input terminal of the third clock signal, a second terminal of the tenth transistor is connected to the a control terminal of the eleventh transistor, and a control terminal of the tenth transistor is connected to the forward scanning control signal input terminal; a first terminal of the eleventh transistor is connected to the forward scanning control signal input terminal, and a second terminal of the eleventh transistor is connected to the pull-down control node; a first terminal of the twelfth transistor is connected to the input terminal of the fourth clock signal, a second terminal of the twelfth transistor is connected to a control terminal of the thirteenth transistor, and a control terminal of the twelfth transistor is connected to the reverse scanning control signal input terminal; and a first terminal of the thirteenth transistor is connected to the reverse scanning control signal input terminal; and a second terminal of the thirteenth transistor is connected to the pull-down control node.

Optionally, the input terminal of the clock control signal further including an input terminal of a third clock signal and an input terminal of a fourth clock signal, and the second pull-down control module further including a tenth transistor, a twelfth transistor, and a fourteenth transistor, wherein: the first terminal of the tenth transistor is connected to the input terminal of the third clock signal, the second terminal of the tenth transistor is connected to the a control terminal of the fourteenth transistor, and the control terminal of the tenth transistor is connected to the forward scanning control signal input terminal; the first terminal of the twelfth transistor is connected to the input terminal of the fourth clock signal, the second terminal of the twelfth transistor is connected to the control terminal of the fourteenth transistor, and the control terminal of the twelfth transistor is connected to the reverse scanning control signal input terminal; and a first terminal of the fourteenth transistor is connected to a high potential terminal, and a second terminal of the fourteenth transistor is connected to the pull-down control node.

Optionally, the pull-down module further including a seventh transistor, an eighth transistor, and a second charging capacitor, wherein: a first terminal of the seventh transistor is connected to the pull-up control node, a second terminal of the seventh transistor is connected to a low potential terminal, and a control terminal of the seventh transistor is connected to the pull-down control node; a first terminal of the eighth transistor is connected to the signal output terminal, a second terminal of the eighth transistor is connected to the low potential terminal, and a control terminal of the eighth transistor is connected to the pull-down control node; and a first terminal of the second charging capacitor is connected to the pull-down control node, and a second terminal of the second charging capacitor is connected to the low potential terminal.

Optionally, the pull-down module further including a ninth transistor, wherein: a first terminal of the ninth transistor is connected to the pull-down control node, a second terminal of the ninth transistor is connected to a low potential terminal, and a control terminal of the ninth transistor is connected to the signal output terminal.

Optionally, the pull-down module further including a fifteenth transistor, wherein: a first terminal of the fifteenth transistor is connected to the pre-charge reset module, a second terminal of the fifteenth transistor is connected to the pull-up control node, and a control terminal of the fifteenth transistor is connected to a high potential terminal.

Another aspect of the present disclosure includes a method for driving the shift register units. The method includes charging a pull-up control node by a pre-charge reset module according to input signals of a forward scanning control signal input terminal, a reverse scanning control signal input terminal, a first signal input terminal, and a second signal input terminal; pulling up an output signal of a signal output terminal by a pull-up module based on signals of the pull-up control node and an input terminal of the first clock signal; and pulling up a potential of a pull-down control node by the first pull-down control module based on input signals of the forward scanning control signal input terminal, the reverse scanning control signal input terminal, the first signal input terminal, and the second signal input terminal. The method also includes pulling down the output signal of the signal output terminal by the first pull-down control module; pulling up the potential of the pull-down control node by the second pull-down control module based on an input signal from an input signal of a clock control signal; and pulling down the output signal of the signal output terminal by the second pull-down control module based on the potential of the pull-down control node.

Another aspect of the present disclosure includes a gate driver, comprising one or more of the disclosed shift register units cascaded together.

Another aspect of the present disclosure includes a display apparatus, including the disclosed gate driver.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

The transistors in the embodiments may be TFTs, field-effect transistors (FETs), or other suitable devices with similar functions. Embodiments should not limit the invention to specific types of transistors. In embodiments of the present disclosure, because the source and the drain of a transistor are symmetric, there is little or no difference between the source and the drain of a transistor. In the disclosed embodiments, to distinguish the source and drain of a transistor, a control terminal may refer to the gate of a transistor, a first terminal may refer to one of the source and drain of a transistor, and a second terminal may refer to the other one of the source and the drain of the transistor. In addition, based on the characteristics of the transistors, the transistors can be divided into N-type transistors and P-type transistors. In the disclosed embodiments, for illustrative purposes, the transistors are N-type transistors. A first terminal may refer to the source of an N-type transistor, and a second terminal may refer to the drain of the N-type transistor. It should be noted that, the working principles of using P-type transistors in the disclosure are known to those skilled in the art and should be within the scope of the present disclosure.

Figure 1:
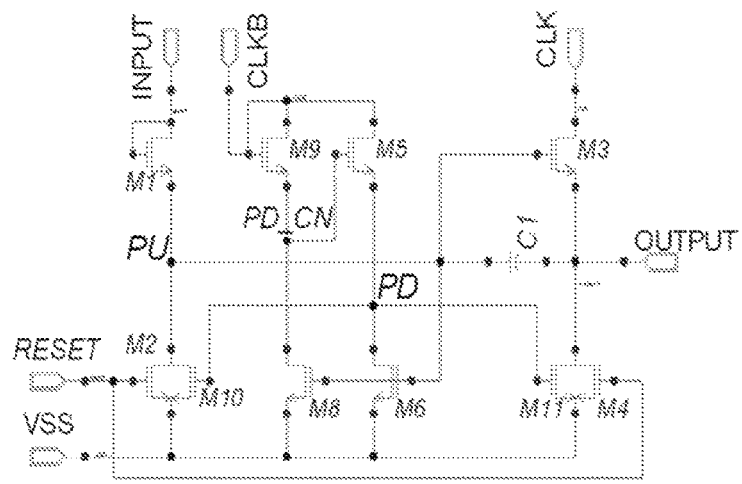
FIG. 1 is a circuit diagram of an existing shift register unit.
Figure 2:
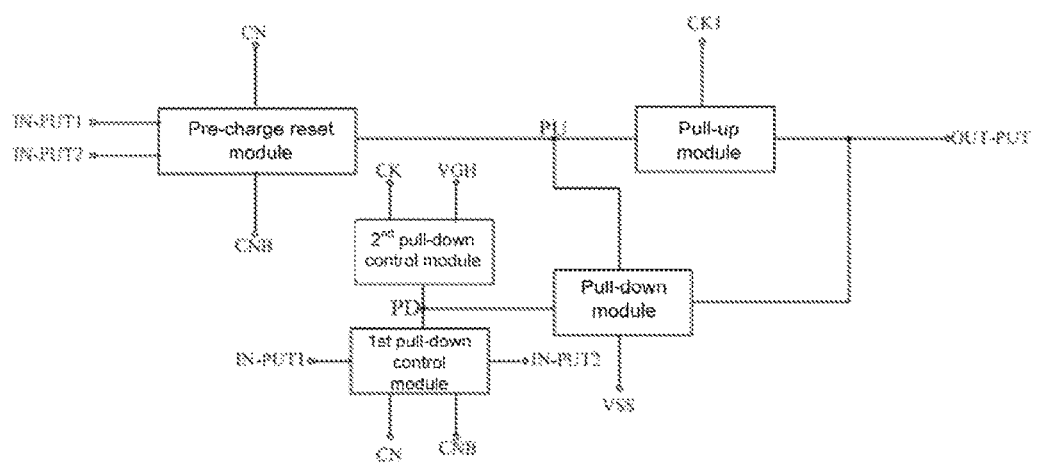
FIG. 2 is a schematic diagram of a shift register unit in at least one embodiment.

FIG. 2 illustrates an exemplary shift register unit. The shift register unit includes a pre-charge reset module, a pull-up module, a pull-down module, a first pull-down control module, and a second pull-down control module. The pre-charge reset module may be connected to a forward scanning reset signal input terminal CN, a reverse scanning control signal input terminal CNB, a first signal input terminal IN-PUT1, a second input terminal IN-PUT2, and a pull-up control node PU. The pre-charge reset module may charge or reset the potential of the pull-up control node PU according to the signals of the forward scanning control signal input terminal CN, the reverse scanning control signal input terminal CNB, the first signal input terminal IN-PUT1, and the second signal input terminal IN-PUT2.

The pull-up module may be connected to the pull-up control node PU, an input terminal of the first clock signal CK1, and a signal output terminal OUT-PUT. The pull-up module may pull the output potential up according to the signals of the pull-up control node PU and the input terminal of the first clock signal CK1. The first pull-down control module may be connected to a pull-down control node PD, the forward scanning control signal input terminal C, the reverse scanning control signal input terminal CNB, the first signal input terminal IN-PUT1, and the second signal input terminal IN-PUT2. The first pull-down control module may pull down the potential of the pull-down control node PD according to the signals from the forward scanning control signal input terminal CN, the reverse scanning control signal input terminal CNB, the first signal input terminal IN-PUT1, and the second signal input terminal IN-PUT2. The second pull-down control module may be connected to the pull-down control node PD and the input terminal of the clock control signal CK. The second pull-down control module may pull up the potential of the pull-down control node PD based on the signals from the input terminal of the clock control signal CK. The pull-down module may be connected to the pull-down control node PD, the pull-up control node PU, and the signal output terminal OUT-PUT. The pull-down module may pull down the potentials of the pull-up control node PU and the output terminal OUT-PUT based on the potential of the pull-down control node.

The shift register unit provided by the embodiment may include the pre-charge reset module, the pull-up module, the pull-down module, the first pull-down control module and the second pull-down control module. The shift register may be used in the gate driver to implement bilateral scanning. The structure of the shift register unit is relatively simple and may be used to realize the thin bezel designs of the display panel. The shift register unit in this embodiment may further control the potential of the pull-down control node through the first pull-down control module and the second pull-down control module. The first pull-down control module may control the potential of the pull-down control node flexibly according to the input signals from the forward scanning control signal input terminal, the reverse scanning control signal input terminal, the first signal input terminal, and the second signal input terminal. This may decrease the output potential of the pull-down module and reduce the signal noise ratio outputted by the output terminal. Further, the shift register unit in this embodiment has a relatively simple structure, therefore it may be used to realize thin bezel display panels.

Figure 3:
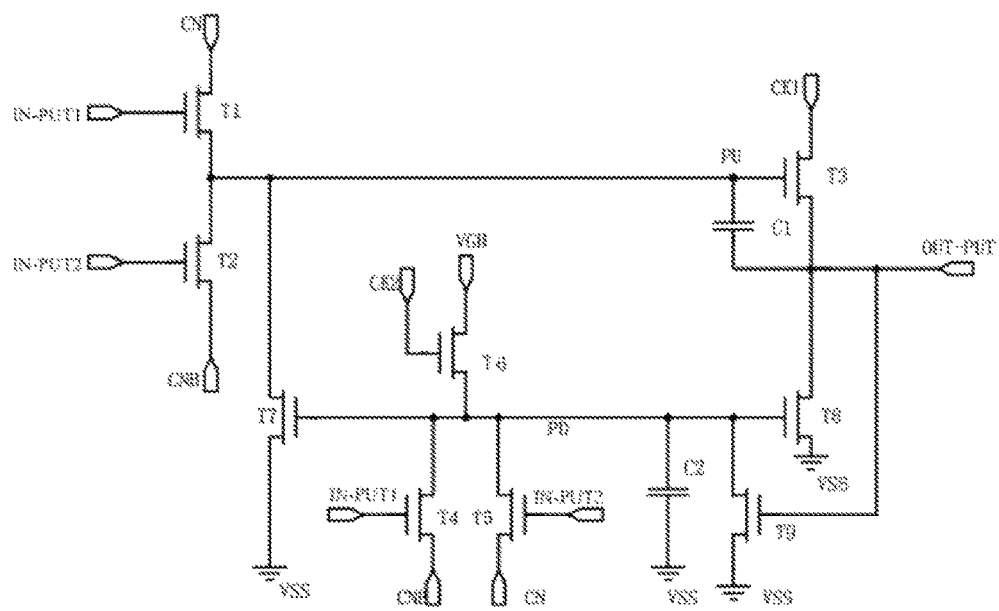
FIG. 3 is a circuit diagram of a shift register unit in at least one embodiment.

FIG. 3 illustrates the pre-charge reset module in some embodiments. The pre-charge reset module may include a first transistor T1 and a second transistor T2. The first terminal of the first transistor T1 may be connected to the input terminal CN of the forward scanning control signal. The second terminal of the first transistor T1 may be connected to the pull-up control node PU. The control terminal of the first transistor T1 may be connected to the first signal input terminal IN-PUT1. The first terminal of the second transistor T2 may be connected to the pull-up control node PU. The second terminal of the second transistor T2 may be connected to the reverse scanning control signal input terminal CNB, and the control terminal of the second transistor T2 may be connected to the second signal input terminal IN-PUT2.

The pre-charge reset module may be used to implement two-directional scanning by gate drivers. The two-directional scanning by the gate drivers may be based on the differences among the high and low level signals inputted from the forward scanning control signal input terminal CN, the reverse scanning control signal input terminal CNB, the input signal terminal IN-PUT1 and the second input signal terminal IN-PUT2.

The first signal input terminal IN-PUT1 may be used to input, e.g., to the shift register unit, an output signal from a shift register unit of a previous level. The second signal input terminal IN-PUT2 may be used to input an output signal from a shift register unit of a next level. Therefore, the gate driver containing the shift register unit may have simple wirings and easily controlled time sequences, and may not use much wiring space.

When the output terminal of the shift register unit of the previous level, OUT-PUT (N−1), outputs a signal of high potential, the first transistor T1 may be turned on. The forward scanning control signal input terminal CN may input a signal of high potential. The first transistor T1 may pre-charge the pull-up control node PU. When the output terminal of the shift register unit of the next level, OUT-PUT (N+1), outputs a signal of high potential, the second transistor T2 may be turned on and may reset the potential at the pull-up control node PU.

When the output terminal of the shift register unit of the next level, OUT-PUT (N+1), outputs a signal of high potential, the second transistor T2 may be turned on. The reverse scanning control signal input terminal CNB may input a signal of high potential. The second transistor T2 may pre-charge the pull-up control node PU. When the output terminal of the shift register unit of the previous level, OUT-PUT (N−1), outputs a signal of high potential, the first transistor T1 may be turned on. The first transistor T1 may reset the potential at the pull-up control node PU.

That is, when the gate drivers scans from the top to the bottom of the display panel, the first transistor T1 may be a pre-charging portion, and the second transistor T2 may be a resetting portion. When the gate drivers scan from the bottom to the top of the display panel, the second transistor T2 may be a pre-charging portion and the first transistor T1 may be a resetting portion.

In this embodiment, the pull-up module may include a third transistor T3 and a first charging capacitor C1. The first terminal of the third transistor T3 may be connected to the first clock signal input signal CK1. The second terminal of the third transistor T3 may be connected to the signal output OUT-PUT. The control terminal of the third transistor T3 may be connected to the pull-up control node PU. The first terminal of the first charging capacitor C1 may be connected to the pull-up control node PU. The second terminal of the first charging capacitor C1 may be connected to the signal output terminal OUT-PUT.

The pull-up module may be used to pull up the output potential of the signal output terminal OUT-PUT so that the signal output terminal OUT-PUT may output a high potential. After the pre-charging processes, i.e., the potential of the pull-up control node PU being pulled to a high potential and the input signal of the input terminal of the first clock signal CK1 being a high potential, the pull-up module may pull up the signal output terminal OUT-PUT of the shift register unit, i.e., of the present level, so that signal output terminal OUT-PUT may output a high potential to drive the gate lines connected to the signal output terminal OUT-PUT.

In this embodiment, the first pull-down control module may include a fourth transistor T4 and a fifth transistor T5. The first terminal of the fourth transistor T4 may be connected to the pull-down control node PD. The second terminal of the fourth transistor T4 may be connected to the reverse scanning control signal input terminal CNB. The control terminal of the fourth transistor T4 may be connected to the first signal input terminal IN-PUT1. The first terminal of the fifth transistor T5 may be connected to the pull-down control node PD. The second terminal of the fifth transistor T5 may be connected to the forward scanning control signal input terminal CN. The control terminal of the fifth transistor T5 may be connected to the second signal input terminal IN-PUT2.

The first pull-down control module may be used to avoid adverse effect to the charging of the pull-up control node PU and to pull down the output potential of the signal output terminal OUT-PUT. When the second transistor T2 is pre-charging the pull-up control node PU, i.e., when the output terminal of the shift register unit of the previous level, OUT-PUT(N−1), outputs a high potential, the first pull-down control module may turn on the fourth transistor T4. The input terminal of the reverse scanning control signal input terminal CNB may input a low potential to pull down the potential of the pull-down control node PD and avoid adverse effect on the charging of the pull-up control node PU. Also, after the pull-up control node PU is reset, i.e., when output terminal of the shift register unit of the next level, OUT-PUT(N+1), outputs a high potential, the first pull-down control module may turn on the fifth transistor T5. The input terminal of the forward scanning control signal terminal CN inputs a high potential to pull up potential of the pull-down control node PD. The pull-down control module may pull down the potential at the signal output terminal OUT-PUT.

In this embodiment, the input terminal of the clock control signal may be an input terminal of the second clock signal CK2. The second pull-down control module may further include a sixth transistor T6. The first terminal of the sixth transistor T6 may be connected to a high potential terminal VGH. The second terminal of the sixth transistor T6 may be connected to the pull-down control node PD. The control terminal of the sixth transistor T6 may be connected to the input terminal of the second clock signal CK2.

When the input terminal of the second clock signal CK2 inputs a signal of high potential, the second pull-down control module may turn on the sixth transistor T6. A signal of high potential, outputted by the high potential terminal VGH, may pull up the potential of the pull-down control node PD. The pull-down control module may maintain a low output potential by the output terminal OUT-PUT until the scanning of the next frame starts.

In this embodiment, the pull-down module may include a seventh transistor T7, an eighth transistor T8, and a second charging capacitor C2. The first terminal of the seventh transistor T7 may be connected to the pull-up control node PU. The second terminal of the seventh transistor T7 may be connected to a low potential terminal VSS. The control terminal of the seventh transistor T7 may be connected to the pull-down control node PD. The first terminal of the eighth transistor T8 may be connected to the signal output terminal OUT-PUT. The second terminal of the eighth transistor T8 may be connected to the low potential terminal VSS. The control terminal may be connected to the pull-down control node PD. The first terminal of the second charging capacitor C2 may be connected to the pull-down control node PD. The second terminal of the second charging capacitor C2 may be connected to the low potential terminal VSS.

When the pull-up control node PU has a low potential and the pull-down control node PD outputs a high potential, the pull-down module may pull down the potential of the pull-up control node PU to reduce noise. Also, when the signal output terminal OUT-PUT outputs a signal of low potential, the pull-down module may reduce the noise of the signal outputted by the signal output terminal OUT-PUT.

Further, the pull-down control module may further include a ninth transistor T9. The first terminal of the ninth transistor T9 may be connected to the pull-down control node PD. The second terminal of the ninth transistor T9 may be connected to the low potential terminal VSS. The control terminal of the ninth transistor T9 may be connected to the signal output terminal OUT-PUT. When the signal output terminal OUT-PUT outputs a high potential, the pull-down module may turn one the ninth transistor T9. Because the ninth transistor T9 is on, the seventh transistor T7 and the eighth transistor T8 may be turned off. Turning off the seventh transistor T7 and the eighth transistor T8 may avoid the output signal of the eighth transistor T8 affecting the output signal by the signal output terminal OUT-PUT.

Figure 7:
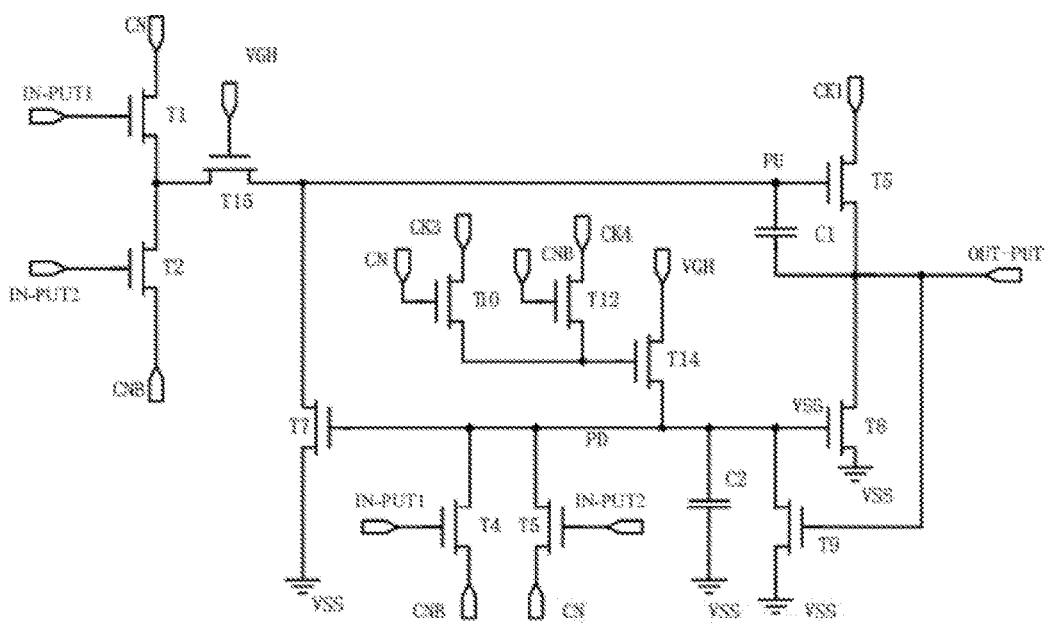
FIG. 7 is a circuit diagram of a shift register unit in some embodiments.

Further, the pull-down control module may further include a fifteenth transistor T15 (not shown in FIG. 3, but shown in FIG. 7). The first terminal of the fifteenth transistor T15 may be connected to the pre-charge reset module. The second terminal of the fifteenth transistor T15 may be connected to the pull-up control node PU. The control terminal of the fifteenth transistor T15 may be connected to the high potential terminal VGH. The seventh transistor T7 may be turned on when the pull-up control node PU has a low potential and the pull-down control node PD outputs a high potential. The leakage current of the seventh transistor T7 may be reduced to avoid adverse effect on the potential of the pull-up control node PU. The output noise by the pull-up control node PU may be reduced.

At least one embodiment provides a method for driving a shift register unit. The method may include a pre-charge stage, an input pull-up stage, an output reset stage, and an output pull-down stage.

In the pre-charge stage, the pre-charge reset module may charge the pull-up control node PU based on the input signals of the forward scanning control signal input terminal CN, the reverse scanning control signal input terminal CNB, the first signal input terminal IN-PUT1, and the second signal input terminal IN-PUT2.

In the output pull-up stage, the pull-up module may pull up the output signal of the output signal terminal OUT-PUT based on the potential at the pull-up control node PU and the signal inputted at the input terminal of the input terminal of the first clock signal CK1.

In the output reset stage, the first pull-down control module pulls up the potential of the pull-down control node PD based on the input signals of the forward scanning control signal input terminal CN, the reverse scanning control signal control terminal CNB, the first signal input terminal IN-PUT1, and the second signal input terminal IN-PUT2. The first pull-down control module may pull down the potential at the signal output terminal OUT-PUT through the pull-down module.

In the output pull-down stage, a second pull-down control module may pull up the potential of the pull-down control node PD based on the signal inputted by the input terminal of the clock control signal. The second pull-down control module may control the pull-down module through the potential at the pull-down control node PD, so that the second pull-down control module may continuously pull down the output potential of the signal output terminal OUT-PUT.

Figure 4:
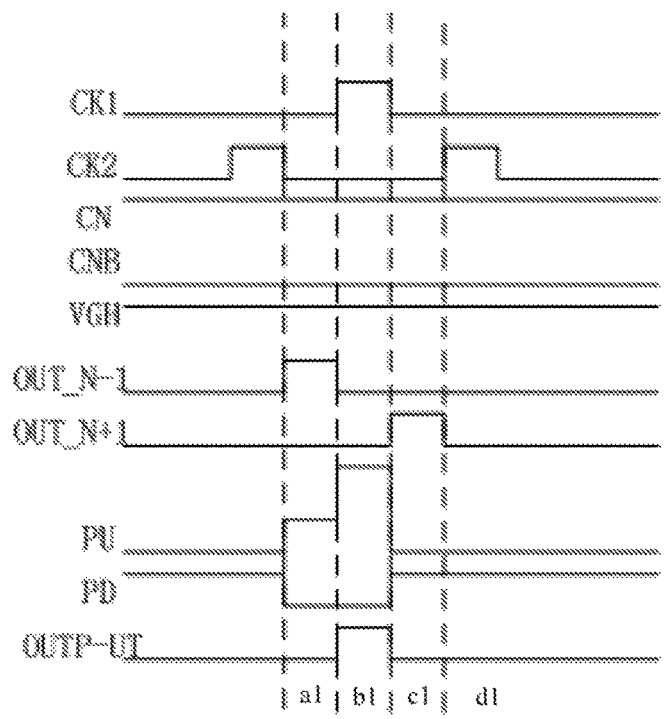
FIG. 4 is a time sequence diagram of a forward scanning process by the shift register unit in at least one embodiment.

Specifically, using the sequence diagram of the forward scanning process shown in FIG. 4, detailed description of the method for driving the shift register unit shown in FIG. 3 and working principle of shift register unit are illustrated. The forward scanning process of the shift register unit may include a pre-charge stage (a1), an output pull-up stage (b1), an output reset stage (c1), and an output pull-down stage (d1).

The forward scanning process may be first operated in the pre-charge stage (a1), as shown in FIG. 4. The input signal at the forward scanning control signal input terminal CN may be a high potential. The input signal at the reverse scanning control signal input terminal CNB may be a low potential. The output signal outputted by the signal output terminal of a shift register unit of the previous level, i.e., OUT-PUT (N−1), may be inputted into the first signal input terminal IN-PUT1. The output signal outputted by the signal output terminal of a shift register unit of the next level, i.e., OUT-PUT (N+1), may be inputted into the second signal input terminal IN-PUT2. The signal inputted into the input terminal of the first clock signal CK1 may have a low potential. The signal inputted into the input terminal of the second clock signal CK2 may have a low potential. At this stage, the signal outputted by the signal output terminal of the shift register unit of the previous level, OUT-PUT (N−1), may be a high potential. The signal outputted by the signal output terminal of the shift register unit of the next level, OUT-PUT (N+1), may be a low potential. Thus, the first transistor T1 may be turned on and the second transistor T2 may be turned off. The potential at the pull-up control node PU may be charged to a high potential. Meanwhile, the fourth transistor T4 may be turned on, and the fifth transistor T5 and the sixth transistor T6 may be turned off. Thus, the potential at the pull-down control node PD may be a low potential. Because the potential at the pull-up control node PU may be a high potential, the third transistor T3 may be turned on. The signal output terminal OUT-PUT may output a low potential. The potential difference between the two terminals of the first charging capacitor C1 may be (VGH−VGL).

The forward scanning process may further be operated in the pre-charge output pull-up stage (b1). The output signal by the signal output terminal of the shift register unit of the previous level, OUT-PUT (N−1), may have a low potential. The output signal by the signal output terminal of the shift register unit of the next level, OUT-PUT (N+1), may be a low potential. That is, the signal inputted into the first signal input terminal IN-PUT1 and the second signal input terminal IN-PUT2 may both be low potentials. The input terminal of the first clock signal CK1 may input a high potential. The input terminal of the second clock signal CK2 may input a low potential. At this stage, the first transistor T1, the second transistor T2, the fourth transistor T4, the fifth transistor T5, and the sixth transistor T6 may be turned off. The third transistor T3 may be turned on. Thus, the signal output terminal OUT-PUT may output a high potential. That is, the potential of the signal output terminal OUT-PUT may be pulled up. Meanwhile, because the output terminal OUT-PUT outputs a high potential, the ninth transistor T9 may be turned on. The potential at the pull-down control node PD may be pulled down. The seventh transistor T7 and the eighth transistor T8 may be turned off. Thus, the output of the signal output terminal OUT-PUT may not be affected. Meanwhile, because of the bootstrapping effect of the first charging capacitor C1, the potential at the pull-up control node PU may be coupled to a higher potential (2VGH−VGL).

The forward scanning process may further be operated in the output reset stage (c1). The output signal by the signal output terminal of the shift register unit of the previous level, OUT-PUT (N−1), may be a low potential. The output signal by the signal output terminal of the shift register unit of the next level, OUT-PUT (N+1), may be a high potential. That is, the signal inputted into the first signal input terminal IN-PUT1 may be a low potential, and the signal inputted into the second signal input terminal IN-PUT2 may have a high potential. The signal inputted into the input terminal of the first clock signal CK1 may change from a high potential to a low potential. The signal inputted into the input terminal of the second clock signal CK2 may be still a low potential. The fifth transistor T5 may be turned on, and the potential at the pull-down control node PD may be pulled up. Thus, the seventh transistor T7 and the eighth transistor T8 may be turned on. The potentials at the pull-up control node PU and the signal output terminal OUT-PUT may be pulled down. The potentials at the pull-down control node PD and at the signal output terminal OUT-PUT can be reset.

The forward scanning process may further be operated in the output pull-down stage (d1). The output signal by the signal output terminal of the shift register unit of the previous level, OUT-PUT (N−1), may be a low potential. The output signal by the signal output terminal of the shift register unit of the next level, OUT-PUT (N+1), may be a low potential. That is, the signal inputted into the first signal input terminal IN-PUT1 may be a low potential, and the signal inputted into the second signal input terminal IN-PUT2 may be a low potential. The signal inputted into the input terminal of the first clock signal CK1 may be a low potential. The signal inputted into the input terminal of the second clock signal CK2 may be a low potential. The first transistor T1, the second transistor T2, the third transistor T3, the fourth transistor T4, the fifth transistor T5, and the sixth transistor T6 may be turned off. The ninth transistor T9 may be turned on. The pull-down control node PD may be charged to a high potential. Thus, the seventh transistor T7 and the eighth transistor T8 may be turned on. The potentials at the signal output terminal OUT-PUT and the pull-up control node PU may be pulled down continuously.

In the subsequent operation, because of the second charging capacitor C2, the potential of the pull-down control node PD may be maintained until the next frame. The potentials at the pull-up control node PU and the signal output terminal OUT-PUT may maintain low.

Figure 5:
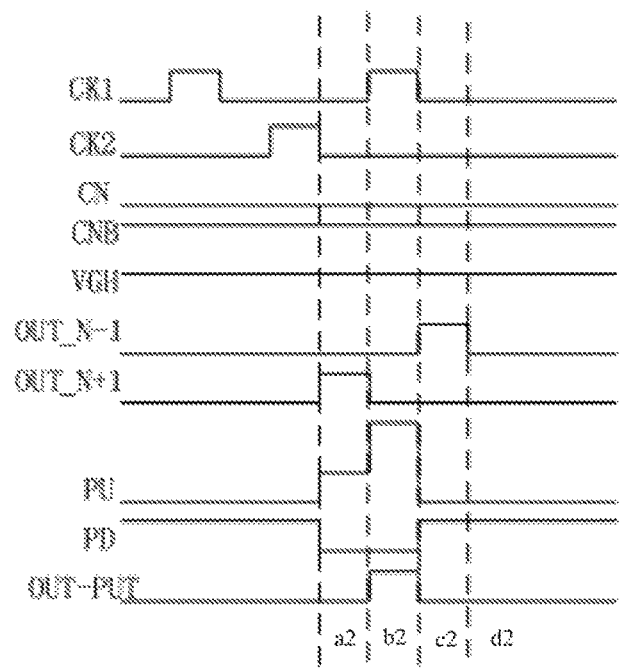
FIG. 5 is a time sequence diagram of a reverse scanning process by the shift register unit in at least one embodiment.

Similarly, using the sequence diagram of the reverse scanning process shown in FIG. 5, detailed description of the method for driving the shift register unit shown in FIG. 3 and working principle of shift register unit are illustrated. The forward scanning process of the shift register unit may include a pre-charge stage (a2), an output pull-up stage (b2), an output reset stage (c2), and an output pull-down stage (d2).

The reverse scanning process may be first operated in the pre-charge stage (a2), as shown in FIG. 4. The input signal at the forward scanning control signal input terminal CN may be a high potential. The input signal at the reverse scanning control signal input terminal CNB may be a high potential. The output signal outputted by the signal output terminal of a shift register unit of the previous level, i.e., OUT-PUT (N−1), may be inputted into the first signal input terminal IN-PUT1. The output signal outputted by the signal output terminal of a shift register unit of the next level, i.e., OUT-PUT (N+1), may be inputted into the second signal input terminal IN-PUT2. The signals inputted into the input terminal of the first clock signal CK1 and the input terminal of the second clock signal CK2 may be low potentials. At this stage, the signal outputted by the signal output terminal of the shift register unit of the previous level, OUT-PUT (N−1), may be a low potential. The signal outputted by the signal output terminal of the shift register unit of the next level, OUT-PUT (N+1), may be a high potential. Thus, the second transistor T2 may be turned on and the first transistor T1 may be turned off. The potential at the pull-up control node PU may be charged to a high potential. Meanwhile, the fifth transistor T5 may be turned on, and the fourth transistor T4 and the sixth transistor T6 may be turned off. Thus, the potential at the pull-down control node PD may be a low potential. Because the potential at the pull-up control node PU may be a high potential, the third transistor T3 may be turned on. The signal output terminal OUT-PUT may output a low potential. The potential difference between the two terminals of the first charging capacitor C1 may be (VGH−VGL).

The reverse scanning process may further be operated in the pre-charge output pull-up stage (b2). The output signal by the signal output terminal of the shift register unit of the previous level, OUT-PUT (N−1), may be a low potential. The output signal by the signal output terminal of the shift register unit of the next level, OUT-PUT (N+1), may be a low potential. That is, the signal inputted into the first signal input terminal IN-PUT1 and the second signal input terminal IN-PUT2 may both be low potentials. The input terminal of the first clock signal CK1 may input a high potential. The input terminal of the second clock signal CK2 may input a low potential. At this stage, the first transistor T1, the second transistor T2, the fourth transistor T4, the fifth transistor T5, and the sixth transistor T6 may be turned off. Because the first charging capacitor C1 discharges, the third transistor T3 may be turned on. Thus, the signal output terminal OUT-PUT may output a high potential. That is, the potential of the signal output terminal OUT-PUT may be pulled up. Meanwhile, because the output terminal OUT-PUT outputs a high potential, the sixth transistor T6 may be turned on. The potential at the pull-down control node PD may be pulled down. The seventh transistor T7 and the eighth transistor T8 may be turned off. Thus, the output of the signal output terminal OUT-PUT may not be affected. Meanwhile, because of the bootstrapping effect of the first charging capacitor C1, the potential at the pull-up control node PU may be coupled to a higher potential (2VGH−VGL).

The reverse scanning process may further be operated in the output reset stage (c2). The output signal by the signal output terminal of the shift register unit of the previous level, OUT-PUT (N−1), may be a high potential. The output signal by the signal output terminal of the shift register unit of the next level, OUT-PUT (N+1), may be a low potential. That is, the signal inputted into the first signal input terminal IN-PUT1 may be a high potential, and the signal inputted into the second signal input terminal IN-PUT2 may have a low potential. The signal inputted into the input terminal of the first clock signal CK1 may change from a high potential to a low potential. The signal inputted into the input terminal of the second clock signal CK2 may still be a low potential. The fourth transistor T4 may be turned on, and the potential at the pull-down control node PD may be pulled up. Thus, the seventh transistor T7 and the eighth transistor T8 may be turned on. The potentials at the pull-up control node PU and the signal output terminal OUT-PUT may be pulled down. The potentials at the pull-down control node PD and at the signal output terminal OUT-PUT can be reset.

The reverse scanning process may further be operated in the output pull-down stage (d2). The output signal by the signal output terminal of the shift register unit of the previous level, OUT-PUT (N−1), may be a low potential. The output signal by the signal output terminal of the shift register unit of the next level, OUT-PUT (N+1), may be a low potential. That is, the signal inputted into the first signal input terminal IN-PUT1 may be a low potential, and the signal inputted into the second signal input terminal IN-PUT2 may be a low potential. The signal inputted into the input terminal of the first clock signal CK1 may be a low potential. The signal inputted into the input terminal of the second clock signal CK2 may be a low potential. The first transistor T1, the second transistor T2, the third transistor T3, the fourth transistor T4, the fifth transistor T5, and the sixth transistor T6 may be turned off. The ninth transistor T9 may be turned on. The pull-down control node PD may be charged to a high potential. Thus, the seventh transistor T7 and the eighth transistor T8 may be turned on. The potentials at the signal output terminal OUT-PUT and the pull-up control node PU may be pulled down continuously.

In subsequent timing sequences, the second charging capacitor C2 may continue to maintain the potential of the pull-down control node PD until the time of the next frame.

Thus the pull-up control node PU and signal output terminal OUT-PUT may maintain the same output signals.

Figure 6:
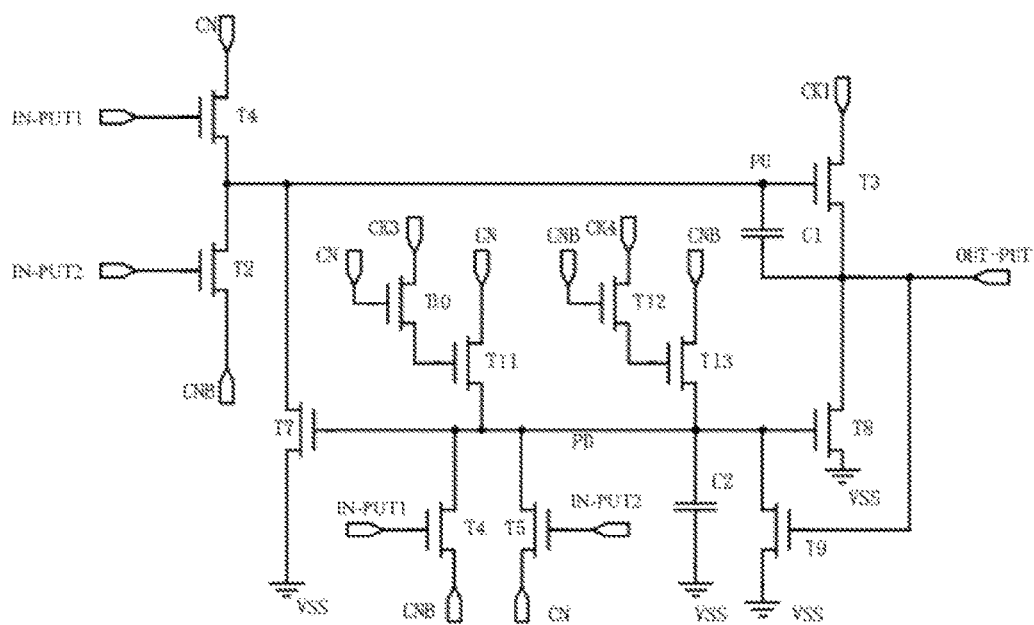
FIG. 6 is a circuit diagram of a shift register unit in some embodiments.

FIG. 6 illustrates a variation of some embodiments. The difference between the shift register unit shown in FIG. 6 and the shift register unit described above may be the configuration of the second pull-down control module. As shown in FIG. 6, the input terminal of the clock control signal may include a third signal input terminal CK3 and a input terminal of the fourth clock signal CK4. The second pull-down control module may include a tenth transistor T10, an eleventh transistor T11, a twelfth transistor T12, and a thirteenth transistor T13. The first terminal of the tenth transistor T10 may be connected to the input terminal of the third clock signal CK3. The second terminal of the tenth transistor T10 may be connected to the control terminal of the twelfth transistor T12. The control terminal of the tenth transistor T10 may be connected to the forward scanning control signal input terminal CN. The first terminal of the eleventh transistor T11 may be connected to the forward scanning control signal input terminal CN. The second terminal of the eleventh transistor T11 may be connected to the pull-down control node PD. The first terminal of the twelfth transistor T12 may be connected to the input terminal of the fourth clock signal CK4. The second terminal of the twelfth transistor T12 may be connected to the control terminal of the thirteenth transistor T13. The control terminal of the twelfth transistor T12 may be connected to the reverse scanning control signal input terminal CNB. The first terminal of the thirteenth transistor T13 may be connected to the reverse scanning control signal input terminal CNB. The second terminal of thirteenth transistor T13 may be connected to the pull-down control node PD.

FIG. 7 illustrates another variation of some embodiment. The difference between the shift register unit shown in FIG. 7 and the shift register unit described above may be the configuration of the second pull-down control module. The input terminal of the clock control signal may include the input terminal of the third clock signal CK3 and the input terminal of the fourth clock signal CK4. The second pull-down control module may include the tenth transistor T10, the twelfth transistor T12, and the fourteenth transistor T14. The first terminal of the tenth transistor T10 may be connected to the input terminal of the third clock signal CK3. The second terminal of the tenth transistor T10 may be connected to the control terminal of the fourteenth transistor T14. The control terminal of the tenth transistor T10 may be connected to the forward scanning control signal input terminal CN. The first terminal of the twelfth transistor T12 may be connected to the input terminal of the fourth clock signal CK4. The second terminal of the twelfth transistor T12 may be connected to the control terminal of the fourteenth transistor T14. The control terminal of the twelfth transistor T12 may be connected to the reverse scanning control signal input terminal CNB. The first terminal of the fourteenth transistor T14 may be connected to the high potential terminal VGH. The second terminal of the fourteenth transistor T14 may be connected to the pull-down control node PD.

The working principles of the two shift register units illustrated in FIGS. 6 and 7 may be similar to the shift register illustrated in FIG. 3, and are not repeated herein.

Embodiments of the present disclosure further provide a gate driver. The gate driver may include cascaded shift register units described in the first embodiment. The first signal input terminal of a shift register unit of each level, i.e., IN-PUT1, may be connected to the signal output terminal of the shift register unit of the previous level, i.e., OUT-PUT (N−1). The second signal input terminal of a shift register unit of each level, i.e., IN-PUT2, may be connected to the signal output terminal of a shift register unit of the next level, i.e., OUT-PUT (N+1).

In this embodiment, the starting signals inputted into the first signal input terminal of the shift register unit of the first level, i.e., IN-PUT1, and the second signal input terminal of the shift register unit of the last level, i.e., IN-PUT2, are the frame-on signal STV.

Figure 8:
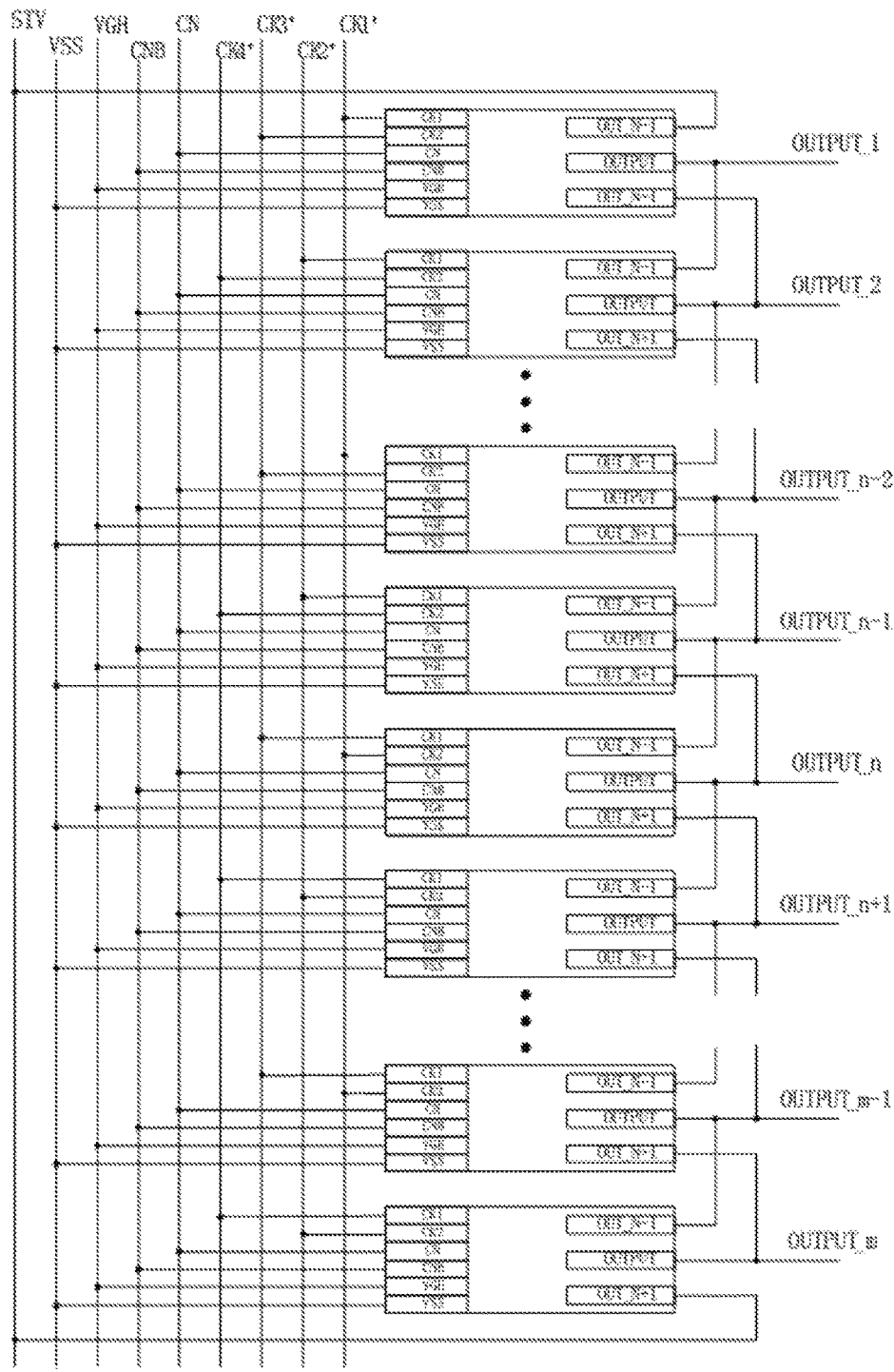
FIG. 8 is a circuit diagram of a gate driver in at least one embodiment.
Figure 9:
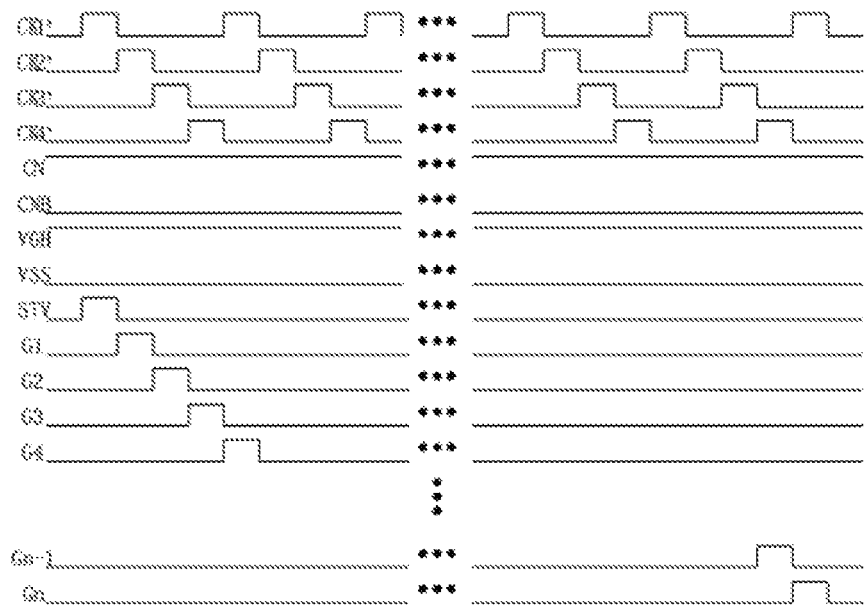
FIG. 9 is a time sequence diagram of a forward scanning process by the gate driver in at least one embodiment.
Figure 10:
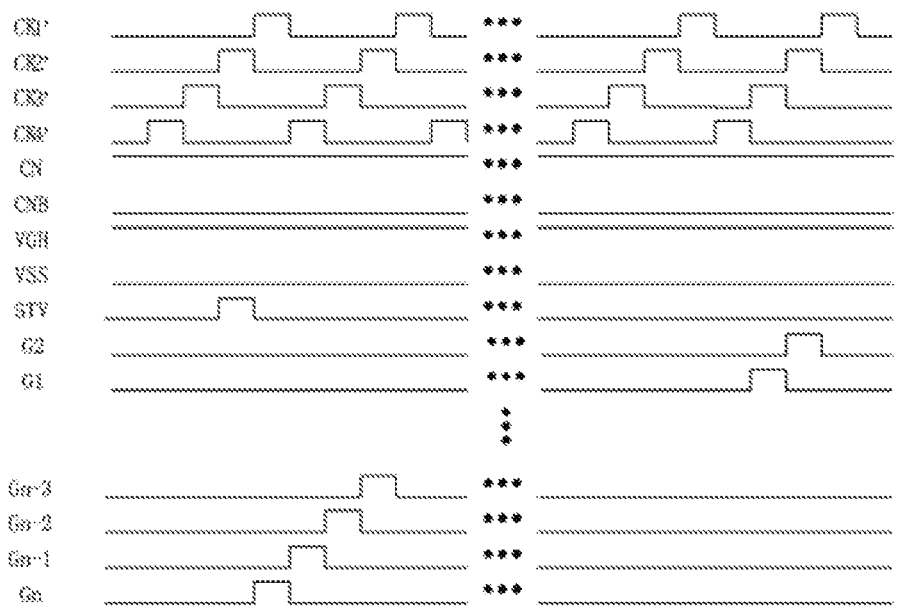
FIG. 10 is a time sequence diagram of a reverse scanning process by the gate driver in at least one embodiment.

FIG. 8 illustrates the circuit of an exemplary gate driver. FIG. 9 illustrates an exemplary forward scanning sequence diagram of the gate driver. FIG. 10 illustrates an exemplary reverse scanning sequence diagrams of the gate driver. As shown in FIGS. 8 to 10, the gate driver may be controlled by four clock control signals. The input terminal of the first clock signal CK1 and the input terminal of the second clock signal CK2, of one of any two adjacent shift register units, may each be inputted with one of a first clock signal CK1' and a third clock signal CK3', respectively. The input terminal of the first clock signal CK1 and the input terminal of the second clock signal CK2, of the other one of the two adjacent shift registers, may each be inputted with a second clock signal CK2' and a fourth clock signal CK4', respectively. Because the gate driver may be controlled by four clock signals, the resolution of the display panel may be improved.

It should be noted that, in FIG. 8, the signal output terminal OUTPUT_m of each of the shift register units may be used to drive the corresponding gate line Gn. Therefore, the timing sequence of a gate line, shown in FIGS. 9 and 10, may be the timing sequence of the output signal of the corresponding signal output terminal. The connection of the shift register units, e.g., being cascaded, may not be limited to the embodiments herein.

Embodiments of the present disclosure further include a display apparatus. The display apparatus may include the disclosed gate driver circuit. The display apparatus may be any products or components with display functions, such as a cell phone, a tablet, a television, a computer monitor, a laptop computer, a digital photo frame, a navigation system, etc.

Because the display apparatus may include the disclosed gate driver, thin bezel designs may be included in the display apparatus may.

It should also be noted that, the display apparatus may also include other suitable structures, such as a display driver unit.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:
1. A shift register unit, comprising:
a pre-charge reset module;
a pull-up module;
a pull-down module;
a first pull-down control module; and
a second pull-down control module, wherein:
the pre-charge reset module is connected to a forward scanning control signal input terminal, a reverse scanning control signal input terminal, a first signal input terminal, a second signal input terminal, and a pull-up control node;

the pull-up module is connected to the pull-up control node, an input terminal of a first clock signal, and a signal output terminal;

the first pull-down control module is connected to a pull-down control node, the forward scanning control signal input terminal, the reverse scanning control signal input terminal, the first signal input terminal, and the second signal input terminal;

the second pull-down control module is connected to the pull-down control node and an input terminal of a clock control signal, the input terminal of the clock control signal including an input terminal of a third clock signal and an input terminal of a fourth clock signal, and the second pull-down control module including a tenth transistor, an eleventh transistor, a twelfth transistor, and a thirteenth transistor;

the pull-down module is connected to the pull-down control node, the pull-up control node, and the signal output terminal;

a first terminal of the tenth transistor is connected to the input terminal of the third clock signal, a second terminal of the tenth transistor is connected to a control terminal of the eleventh transistor, and a control terminal of the tenth transistor is connected to the forward scanning control signal input terminal;

a first terminal of the eleventh transistor is connected to the forward scanning control signal input terminal, and a second terminal of the eleventh transistor is connected to the pull-down control node;

a first terminal of the twelfth transistor is connected to the input terminal of the fourth clock signal, a second terminal of the twelfth transistor is connected to a control terminal of the thirteenth transistor, and a control terminal of the twelfth transistor is connected to the reverse scanning control signal input terminal; and a first terminal of the thirteenth transistor is connected to the reverse scanning control signal input terminal, and a second terminal of the thirteenth transistor is connected to the pull-down control node.

2. The shift register unit according to claim 1, wherein:

the pre-charge reset module is configured to reset a potential of the pull-up control node according to input signals from the forward scanning control signal input terminal, the reverse scanning control signal input terminal, the first signal input terminal, and the second signal input terminal.

3. The shift register unit according to claim 1, wherein:

the pull-up module is configured to pull up a potential of the signal output terminal according to a potential from the pull-up control node and an input signal from the input terminal of the first clock signal.

4. The shift register unit according to claim 1, wherein:

the first pull-down control module is configured to control a potential of the pull-down control node according to signals from the forward scanning control signal input terminal, the reverse scanning control signal input terminal, the first signal input terminal, and the second signal input terminal.

5. The shift register unit according to claim 1, wherein:

the second pull-down control module is configured to control the potential of the pull-down control node according to signals from the input terminal of the clock control signal.

6. The shift register unit according to claim 1, wherein:

the pull-down module is configured to control potentials of the pull-up control node and the signal output terminal according to the potential of the pull-down control node.

7. The shift register unit according to claim 1, the pre-charge reset module further including a first transistor and a second transistor, wherein:

a first terminal of the first transistor is connected to the forward scanning control signal input terminal, a second terminal of the first transistor is connected to the pull-up control node, and a control terminal of the first transistor is connected to the first signal input terminal; and a first terminal of the second transistor is connected to the pull-up control node, a second terminal of the second transistor is connected to the reverse scanning control signal input terminal, and a control terminal of the second transistor is connected to the second signal input terminal.

8. The shift register unit according to claim 1, the pull-up module further including a third transistor and a first charging capacitor, wherein:

a first terminal of the third transistor is connected to the input terminal of the first clock signal, a second terminal of the third transistor connected to the signal output terminal, and a control terminal of the third transistor is connected to the pull-up control node; and a first terminal of the first charging capacitor is connected to the pull-up control node and a second terminal of the first charging capacitor is connected to the signal output terminal.

9. The shift register unit according to claim 1, the first pull-down control module further including a fourth transistor and a fifth transistor, wherein:

a first terminal of the fourth transistor is connected to the pull-down control node, a second terminal of the fourth transistor is connected to the reverse scanning control signal input terminal, and a control terminal of the fourth transistor connected to the first signal input terminal; and a first terminal of the fifth transistor is connected to the pull-down control node, a second terminal of the fifth transistor is connected to the forward scanning control signal input terminal, and a control terminal of the fifth transistor is connected to the second signal input terminal.

10. The shift register unit according to claim 1, the pull-down module further including a seventh transistor, an eighth transistor, and a second charging capacitor, wherein:

a first terminal of the seventh transistor is connected to the pull-up control node, a second terminal of the seventh transistor is connected to a low potential terminal, and a control terminal of the seventh transistor is connected to the pull-down control node;

a first terminal of the eighth transistor is connected to the signal output terminal, a second terminal of the eighth transistor is connected to the low potential terminal, and a control terminal of the eighth transistor is connected to the pull-down control node; and a first terminal of the second charging capacitor is connected to the pull-down control node, and a second terminal of the second charging capacitor is connected to the low potential terminal.

11. The shift register unit according to claim 10, the pull-down module further including a ninth transistor, wherein:

a first terminal of the ninth transistor is connected to the pull-down control node, a second terminal of the ninth transistor is connected to a low potential terminal, and a control terminal of the ninth transistor is connected to the signal output terminal.

12. The shift register unit according to claim 1, the pull-down module further including a fifteenth transistor, wherein:

a first terminal of the fifteenth transistor is connected to the pre-charge reset module, a second terminal of the fifteenth transistor is connected to the pull-up control node, and a control terminal of the fifteenth transistor is connected to a high potential terminal.

13. A method for driving the shift register unit according to claim 1, comprising:

charging a pull-up control node by a pre-charge reset module according to input signals of a forward scanning control signal input terminal, a reverse scanning control signal input terminal, a first signal input terminal, and a second signal input terminal;

pulling up an output signal of a signal output terminal by a pull-up module based on signals of the pull-up control node and an input terminal of the first clock signal;

pulling up a potential of a pull-down control node by the first pull-down control module based on input signals of the forward scanning control signal input terminal, the reverse scanning control signal input terminal, the first signal input terminal, and the second signal input terminal;

pulling down the output signal of the signal output terminal by the first pull-down control module;

pulling up the potential of the pull-down control node by the second pull-down control module based on an input signal from an input signal of a clock control signal;

pulling down the output signal of the signal output terminal by the second pull-down control module based on the potential of the pull-down control node.

14. A gate driver, comprising one or more shift register units according to claim 1.

15. A display apparatus, including the gate driver according to claim 14.

16. A shift register unit, comprising:
a pre-charge reset module;
a pull-up module;
a pull-down module;
a first pull-down control module; and
a second pull-down control module, wherein:
the pre-charge reset module is connected to a forward scanning control signal input terminal, a reverse scanning control signal input terminal, a first signal input terminal, a second signal input terminal, and a pull-up control node;
the pull-up module is connected to the pull-up control node, an input terminal of a first clock signal, and a signal output terminal;
the first pull-down control module is connected to a pull-down control node, the forward scanning control signal input terminal, the reverse scanning control signal input terminal, the first signal input terminal, and the second signal input terminal;
the second pull-down control module is connected to the pull-down control node and an input terminal of a clock control signal, the input terminal of the clock control signal including an input terminal of a third clock signal and an input terminal of a fourth clock signal, and the second pull-down control module including a tenth transistor, a twelfth transistor, and a fourteenth transistor;
the pull-down module is connected to the pull-down control node, the pull-up control node, and the signal output terminal;
a first terminal of the tenth transistor is connected to the input terminal of the third clock signal, a second terminal of the tenth transistor is connected to a control terminal of the fourteenth transistor, and a control terminal of the tenth transistor is connected to the forward scanning control signal input terminal;
a first terminal of the twelfth transistor is connected to the input terminal of the fourth clock signal, a second terminal of the twelfth transistor is connected to a control terminal of the fourteenth transistor, and a control terminal of the twelfth transistor is connected to the reverse scanning control signal input terminal; and
a first terminal of the fourteenth transistor is connected to a high potential terminal, and a second terminal of the fourteenth transistor is connected to the pull-down control node.

* * * * *